(12) United States Patent
Gonzalez (10) Patent No.: US 6,548,340 B2
(45) Date of Patent: Apr. 15, 2003

(54) METHOD OF FABRICATING A DRAM TRANSISTOR WITH A DUAL GATE OXIDE TECHNIQUE

(75) Inventor: Fernando Gonzalez, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/779,924

(22) Filed: Feb. 8, 2001

(65) Prior Publication Data

US 2001/0008808 A1 Jul. 19, 2001

Related U.S. Application Data

(63) Continuation of application No. 09/191,235, filed on Nov. 13, 1998, now Pat. No. 6,204,106, which is a continuation of application No. 08/548,011, filed on Oct. 25, 1995, now Pat. No. 5,863,819.

(51) Int. Cl.[7] .................................... H01L 21/8242
(52) U.S. Cl. ........................ 438/238; 438/981
(58) Field of Search ..................... 438/238, 253–256, 438/381, 396–399, 981

(56) References Cited

U.S. PATENT DOCUMENTS

| 4,627,153 A | 12/1986 | Masuoka |
| 4,651,406 A | 3/1987 | Shimizu et al. |
| 4,675,982 A | 6/1987 | Noble, Jr. et al. |
| 4,957,787 A | 9/1990 | Lowrey et al. |
| 5,021,848 A | * 6/1991 | Chiu |
| 5,057,449 A | 10/1991 | Lowrey et al. |
| 5,079,177 A | 1/1992 | Lage et al. |
| 5,153,685 A | 10/1992 | Murata et al. |
| 5,225,362 A | * 7/1993 | Bergemont |
| 5,404,037 A | * 4/1995 | Manley ...................... 257/321 |
| 5,672,539 A | 9/1997 | Thakur et al. |
| 5,837,574 A | 11/1998 | Bergemont et al. |

* cited by examiner

Primary Examiner—Jey Tsai
(74) Attorney, Agent, or Firm—Thorp Reed & Armstrong LLP (57) ABSTRACT

The process comprises the steps of growing a first oxide layer on the upper surface of a substrate; depositing a silicon nitride layer on top of the first oxide layer; patterning the silicon nitride layer with a photoresist mask to define field oxide areas; stripping the oxide layer and regrowing a pad oxide layer on the upper surfaces of the substrate not covered by the remnants of the silicon nitride layer; removing the remnants of the silicon nitride layer; stripping the pad oxide layer and growing a sacrificial oxide layer; masking the sacrificial oxide layer with a photoresist to protect the area where the memory array will be formed; stripping the sacrificial oxide not protected by the photoresist; stripping the photoresist; and growing a gate oxide layer which is thinner than the sacrificial oxide layer. Thereafter, fabrication of the memory device may be completed using any known prior art techniques.

7 Claims, 6 Drawing Sheets

METHOD OF FABRICATING A DRAM TRANSISTOR WITH A DUAL GATE OXIDE TECHNIQUE

This application is a continuation of U.S. patent application Ser. No. 09/191,235 filed Nov. 13, 1998, U.S. Pat. No. 6,204,106 which is a continuation of U.S. patent application Ser. No. 08/548,011 filed Oct. 25, 1995, now U.S. Pat. No. 5,863,819.

BACKGROUND OF THE INVENTION

1. Field of the Invention

The present invention relates to semiconductor fabrication techniques, and more particularly to techniques for fabricating dynamic random access memories (DRAM).

2. Description of the Background

A DRAM array is comprised of individual memory cells arranged in columns and rows on a lightly-doped silicon substrate. Each cell has a field-effect access transistor and a storage capacitor. The capacitor, which is directly connected to the transistor's source or storage node, may be charged and discharged through the transistor's channel. Transistor gates and gate interconnects within an array row are formed from a ribbon of conductive material which runs the length of the row. That conductive ribbon is known as a rowline. Between consecutive transistor gate within a row, the rowline traverses a field oxide region. In active areas of the array (locations where the rowline functions as a gate), the rowline is insulated from the substrate by a layer of gate oxide. When voltage is applied to each rowline through a driver transistor, all the transistors in the row are turned on. The access node of each transistor is connected to a columnar bit line. To determine the capacitor charge value (which may be equated with either a "1" or a "0" binary value), a column sense amp at the end of the bit line compares the capacitor charge to a reference voltage.

The speed of a dynamic random access memory is dependent on a number of factors. One of the primary factors is access speed, i.e., the speed at which a rowline can turn on the transistors of the cells along a row. Rowline access speed is inversely proportional to the rowline's resistance multiplied by its capacitance, i.e., an RC time constant. In other words, an increase in either the resistance of the capacitance of the rowline will degrade access speed. The reduction of rowline resistance is easily achieved. In fact, current DRAM designs typically utilize rowlines constructed from conductively-doped polycrystalline silicon (hereinafter "Polysilicon") that has been silicided with a refractory metal such as titanium, platinum, palladium, cobalt, or tungsten. The resistance of a silicided, conductively-doped polysilicon is generally within the range of 5–25 ohms per square, whereas the resistance of titanium silicided conductively-doped polysilicon, for example, is approximately 2 ohms per square.

The reduction of rowline capacitance, however, is more problematic. Rowline capacitance is roughly equal to the summation of the polysilicon gate-to-substrate capacitances, because the field oxide regions are relatively thick and capacitances of the word line over those regions is relatively minimal. Using most current production techniques, all transistors within a DRAM array (whether they be cell access transistors or transistors within the periphery) utilize a single thickness of gate oxide. To reduce rowline capacitance using such fabrication techniques, it would be necessary to increase the gate oxide layer thickness. Because capacitance is inversely proportional to dielectric layer thickness, a doubling of dielectric layer thickness should approximately halve rowline capacitance. However, the drive current at maximum voltage for the peripheral, rowline driver transistors is decreased by the increase in dielectric layer thickness. Because of reduction in drive current will result in a reduction in rowline access speed, the gain in speed achieved through the reduction in rowline capacitance will be offset by the reduction in speed caused by decreased drive current.

A solution to the aforementioned problem is set forth in U.S. Pat. No. 5,057,499 entitled Process For Creating Two Thicknesses of Gate Oxide Within A Dynamic Random Access Memory. The invention disclosed therein achieves a net increase in rowline access speed by providing a process for creating DRAM memories having dual layers of gate oxide of different thicknesses. Peripheral driver transistors are constructed on top of a thin layer of gate oxide to optimize their performance whereas cell access transistors are constructed on top of a thicker layer of gate oxide to minimize rowline capacitance.

The process of U.S. Pat. No. 5,057,499 begins by thermally growing a first layer of gate oxide on a silicon substrate. The first layer is then masked with photoresist in regions where cell access transistors will ultimately be fabricated. All oxide that is not masked is removed with an oxide etch. After the photoresist is stripped, a second layer of gate oxide is thermally grown on the substrate. During the growth of the second gate oxide layer, the thickness of the remaining fist oxide layer portions increases, but at a rate considerably slower than that at which new oxide initially forms on bare substrate regions. The resultant gate oxide layer, which then comprises regions of two different thicknesses, is used as a pad oxide layer during a conventional local oxidation of silicon (LOCOS) operation; nitride is deposited on the resultant gate oxide layer, masked, and etched to create regions devoid of nitride where field oxide regions will be grown. The field oxide regions are then thermally grown, and DRAM fabrication proceeds in a conventional manner.

While the invention of U.S. Pat. No. 5,057,449 provides a fabrication technique which enables gate oxide layers of different thicknesses to be fabricated, the need still exists to create fabrication techniques that enable gate oxide layers of different thicknesses to be fabricated using fewer process steps and or fewer masks.

SUMMARY OF THE INVENTION

Figure 3:
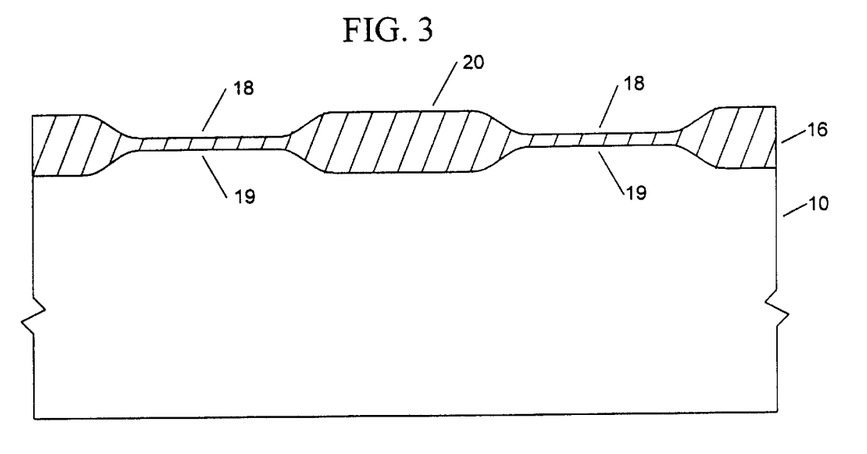
FIG. 3 illustrates the substrate of FIG. 2 after an oxide layer has been thermally grown on the upper surfaces of the substrate not covered by the remnants of the silicon nitride layer and after the remnants of the silicon nitride layer have been removed.

The present invention is directed to a fabrication technique in which dual gate oxide thicknesses are provided but with less steps and one less mask than is currently required. Beginning with a substrate on which a local oxidation of silicon process has been performed, i.e., a substrate as shown in FIG. 3, the process comprises the steps of stripping a pad oxide layer and growing a sacrificial oxide layer; masking the sacrificial oxide layer with a photoresist to protect the area where the memory array will be formed; stripping the sacrificial oxide not protected by the photoresist; stripping the photoresist; and growing a gate oxide layer which is thinner than the sacrificial oxide layer. Thereafter, fabrication of the memory device may be completed using any known prior art techniques.

Starting with a bare substrate, the process comprises the steps of growing a first oxide layer on the upper surface of a substrate; depositing a silicon nitride layer on top of the first oxide layer; patterning the silicon nitride layer with a photoresist mask to define field oxide areas; stripping the oxide layer and regrowing a pad oxide layer on the upper surfaces of the substrate not covered by the remnants of the silicon nitride layer; removing the remnants of the silicon nitride layer; stripping the pad oxide layer and growing a sacrificial oxide layer; masking the sacrificial oxide layer with a photoresist to protect the area where the memory array will be formed; stripping the sacrificial oxide not protected by the photoresist; stripping the photoresist; and growing a gate oxide layer which is thinner than the sacrificial oxide layer. Thereafter, fabrication of the memory device may be completed using any known prior art techniques.

According to one embodiment of the present invention, the step of striping the pad oxide and growing a sacrificial oxide layer can be eliminated if the pad oxide layer has the desired characteristics.

One advantage of the present invention is that the mask used as an implant mask to protect the area which will form the memory array is also used as an etch mask for etching the sacrificial oxide. That eliminates the need to create a separate etch mask and saves time by eliminating the steps associated with applying a separate etch mask. The diode characteristics are improved by the process of the present invention because the array area is protected during the implantation step for the peripheral devices. Static refresh times are improved. The process of the present invention also enables the thickness of the gate oxide to be tailored for the desired function thereby improving such characteristics as the subthreshold voltage and gate induced drain leakage. Those and other advantages and benefits will become apparent from the Description Of A Preferred Embodiment hereinbelow.

BRIEF DESCRIPTION OF THE DRAWINGS

For the present invention to be clearly understood and readily practiced, the present invention will be described in conjunction with the following figures wherein.

DESCRIPTION OF THE PREFERRED EMBODIMENTS

Figure 1:
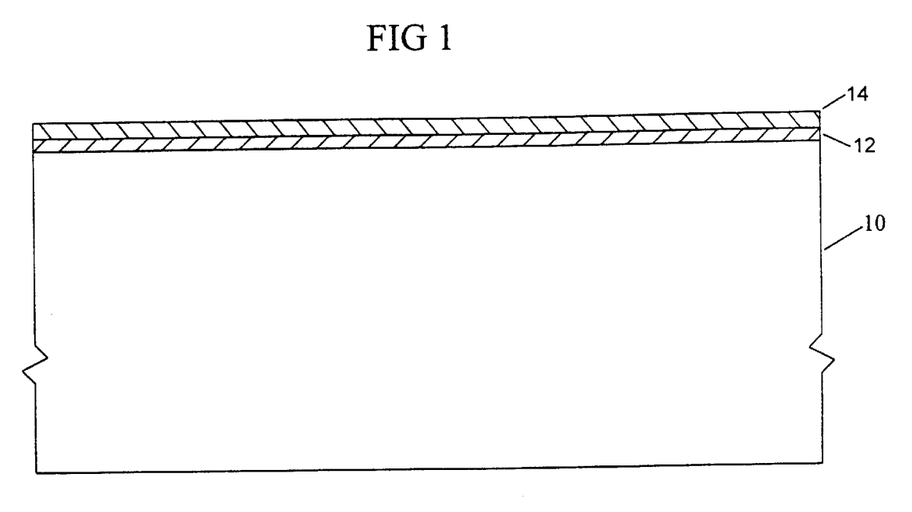
FIG. 1 illustrates a substrate with a first gate oxide layer grown on a surface thereof and a layer of silicon nitride deposited on top of the gate oxide layer.

The present invention is directed to a process for creating two thicknesses of gate oxide within a dynamic random access memory. A thick gate oxide is provided within the array to minimize the rowline capacitance. A thin layer of gate oxide is provided for the peripheral devices to provide for increased speed. The process begins, as shown in FIG. 1, with a first silicon dioxide layer 12 being thermally grown on the upper surface of a silicon substrate 10 to a thickness of approximately 200–250 angstroms. A layer of silicon nitride 14 is deposited on top of the silicon dioxide layer 12.

Figure 2:
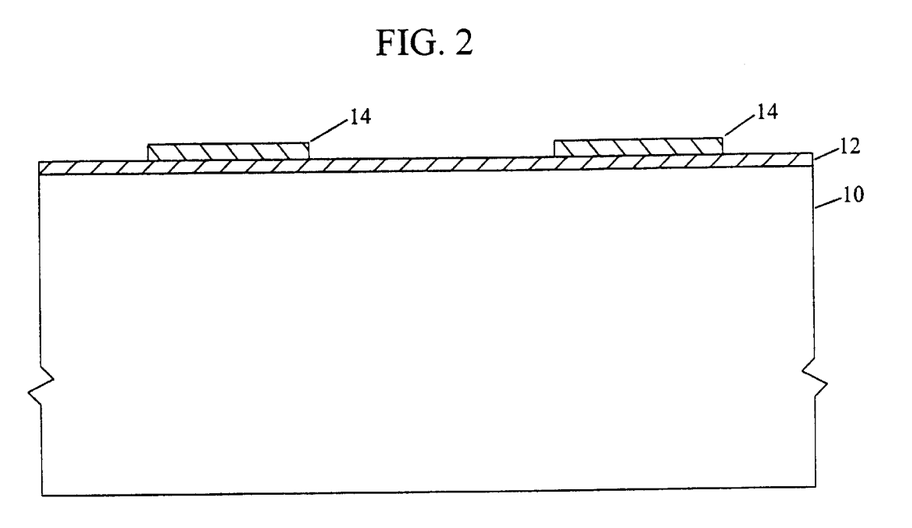
FIG. 2 illustrates the substrate of FIG. 1 after the silicon nitride layer has been patterned with a photoresist mask to define oxide regions which will become future active areas.

The silicon nitride 14 is covered with a photoresist, which is patterned according to an appropriate mask. Thereafter, those portions of the silicon nitride 14 defined by the mask are removed so that the silicon nitride layer 14 is patterned as shown FIG. 2. Those portions of the oxide layer 12 not masked by the silicon nitride 14 are stripped so that portions of the silicon substrate 10 are exposed. Thereafter, a silicon dioxide layer 16 (FIG. 3) is grown on the exposed surfaces of the substrate 10. The remaining portions of silicon nitride 14 are selectively stripped so as not to etch the oxide layer 16 thereby leaving the oxide layer 16 with the configuration illustrated in FIG. 3. The oxide layer 16 is made up of pad oxide regions 18 which cover gate regions 19. The pad oxide regions 18, which were masked by portions of the silicon nitride 14, are approximately 200–250 angstroms thick. The pad oxide regions 18 are part of the original oxide layer 12. The pad oxide regions 18 are connected by field oxide regions 20 which may have a thickness of 4,000–6,000 angstroms. The process steps which produce the oxide layer 16 having the configuration as shown in FIG. 3 is sometimes referred to as a local oxidation of silicon (LOCOS) operation.

Figure 4:
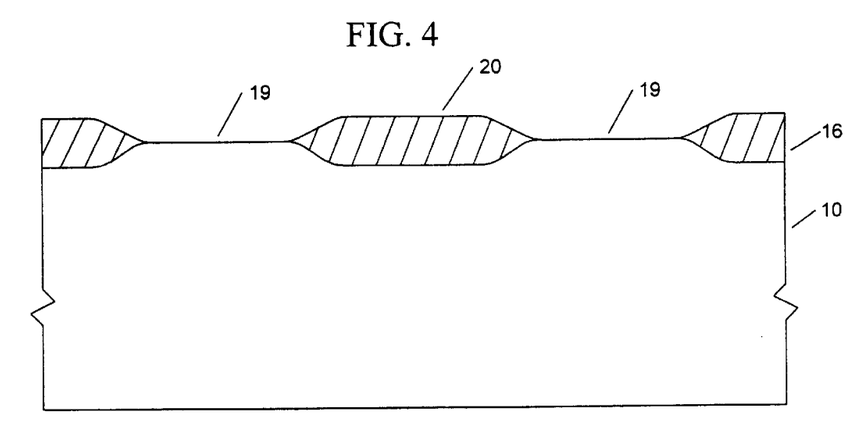
FIG. 4 illustrates the substrate of FIG. 3 after the pad oxide has been stripped to expose the substrate in the regions which will become future active areas.
Figure 5:
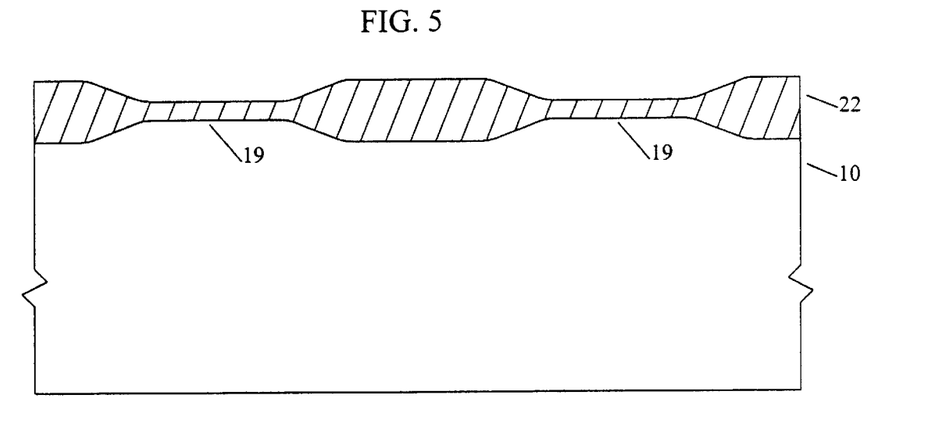
FIG. 5 illustrates the substrate of FIG. 4 after a thick sacrificial oxide layer has been grown.

In FIG. 4, the oxide layer 16 is subjected to a stripping operation which completely removes the pad oxide regions 18 and reduces the field oxide in regions 20 by approximately the same small amount. The substrate 10 is subjected to conditions which allow an oxide layer to be regrown as shown in FIG. 5 by the reference number 22. The regrown oxide layer 22 is approximately 350 angstroms thick in gate regions 19. The oxide layer 22 is sometimes referred to as the sacrificial oxide layer. It should be noted, as an alternative to the strip and regrow shown in FIG. 4, if the pad oxide 18 is in sufficiently good condition, and sufficiently close to the final dimension of the thick gate, the process could continue directly from FIG. 3 to the steps illustrated in FIG. 5 skipping the strip and regrow step of FIG. 4.

Figure 6:
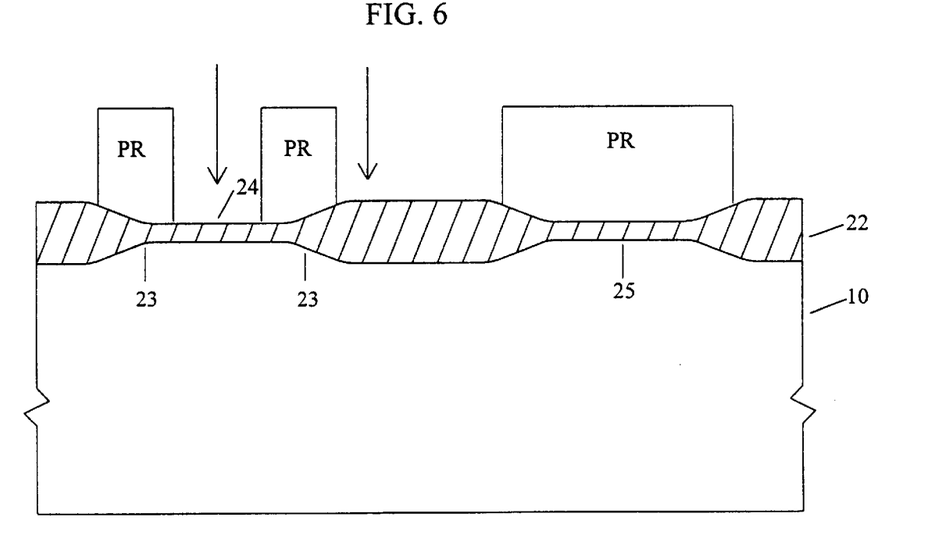
FIG. 6 illustrates the substrate of FIG. 5 after a photoresist has been patterned to define local integrated field implant areas.

In FIG. 6, the sacrificial oxide layer 22 is covered with photoresist which is patterned according to a field implant mask. The purpose of the field implant mask is to protect the storage node areas 23 from the dopant. Another purpose of the mask is to protect the area 25 where the peripheral devices will be fabricated. In the case of a CMOS process, the periphery p-channel devices would also be protected. The field implant is a high energy (approximately 150 to 200 KeV) implant with a dose of 1 to $5 \times 10^{12}$ atoms/cm$^2$ of boron. The high energy implant is for isolation purposes. The high energy implant is followed by a low energy (approximately 25 KeV) implant with a dose of 1 to $2 \times 10^{12}$ atoms/cm$^2$ of boron or boron fluoride (BF$_2$). The low energy implant increases the threshold voltage of the future array devices. The implants take place in the area 24. The implant areas in the substrate resulting from the implants are shown only in FIG. 12 for purposes of clarity. After the implant steps, the photoresist illustrated in FIG. 6 is stripped.

Figure 7:
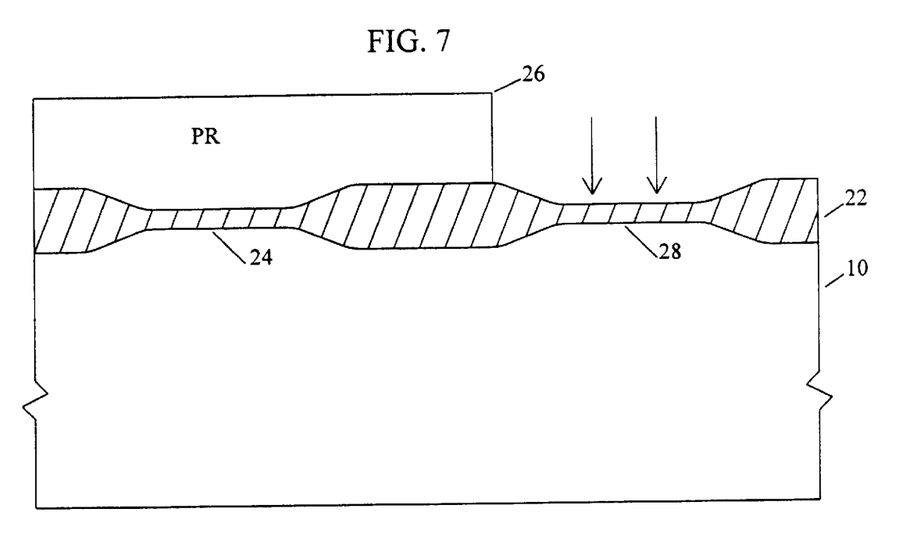
FIG. 7 illustrates the substrate of FIG. 6 masked to protect the array.
Figure 8:
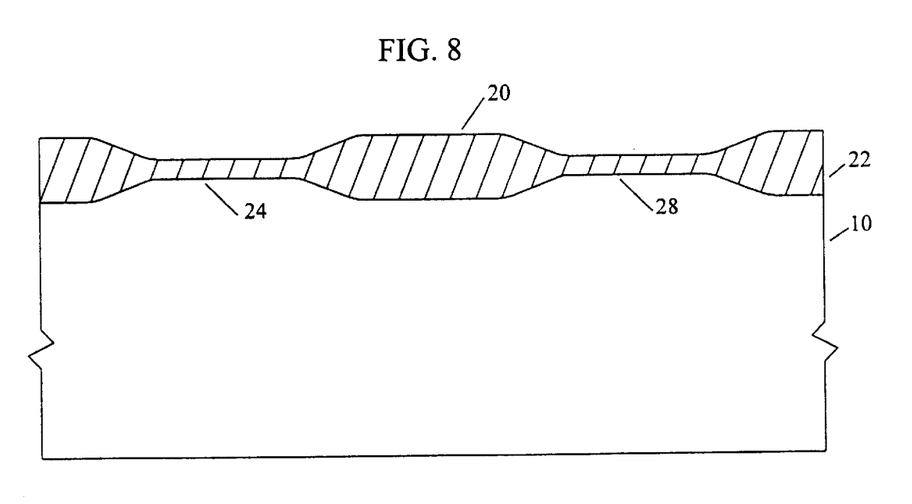
FIG. 8 illustrates the substrate of FIG. 7 after the exposed thick oxide has been stripped, the photoresist removed, and a thin gate oxide layer grown.

In FIG. 7, a new layer of photoresist 26 is provided on top of sacrificial oxide layer 22 and patterned according to a mask. The mask is a noncritical mask with respect to alignment. The purpose of the mask is to protect the thick gate oxide in the implant area 24 while at the same time exposing implant area 28. After implantation, the sacrificial oxide 22 exposed by the photoresist layer 26 is etched such that the sacrificial oxide in implant area 28 is completely removed exposing the underlying silicon substrate 10. Thereafter, the photoresist layer 26 is stripped and a thin oxide layer is grown. Growing the thin oxide layer results, as shown in FIG. 8, in a thin gate oxide layer in implant area 28 of approximately 100 angstroms. As a result of growing the 100 angstroms thick oxide layer, the gate oxide in implant area 24 also grows. If the 250 angstrom pad oxide was used, after the strip and regrow step occurring between FIGS. 7 and 8, the oxide in implant area 24 may be approximately 325 angstroms thick. Alternative, if the pad oxide was stripped and regrown, then the 350 angstrom oxide layer in implant area 24 may increase in thickness to approximately 410 angstroms. The oxide layer 22 appearing in FIG. 8 thus has a thick gate oxide portion in implant area 24, a thin gate oxide portion in implant area 28, and thick field oxide portions 20 therebetween.

It is seen that the photoresist layer 26 of FIG. 7 acts as both an implant mask and an etch mask. That saves a process step inasmuch as there is no need for a separate implant mask and a separate etch mask.

Figure 9:
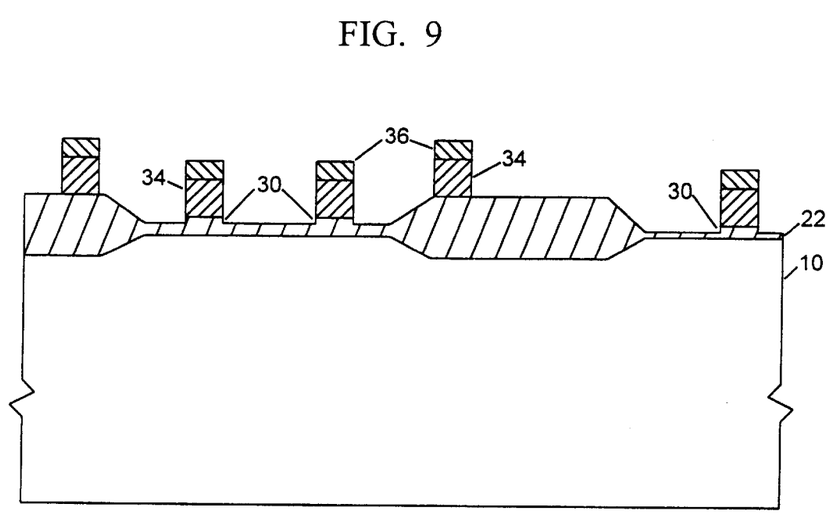
FIG. 9 illustrates the substrate of FIG. 8 after the gate oxide layers has been masked and etched to form gate regions.

Fabrication of the device may continue as shown in FIG. 9 using any known conventional techniques. For example, a layer of polysilicon 34 may be deposited and etched followed by an oxide layer 36 which is grown and etched. During that subsequent processing, the oxide layer 22 may be over-etched resulting in the gate regions 30 illustrated in FIG. 9. The thicker gate oxide allows for a greater amount of over etching while still maintaining a desirable defect density.

Figure 10:
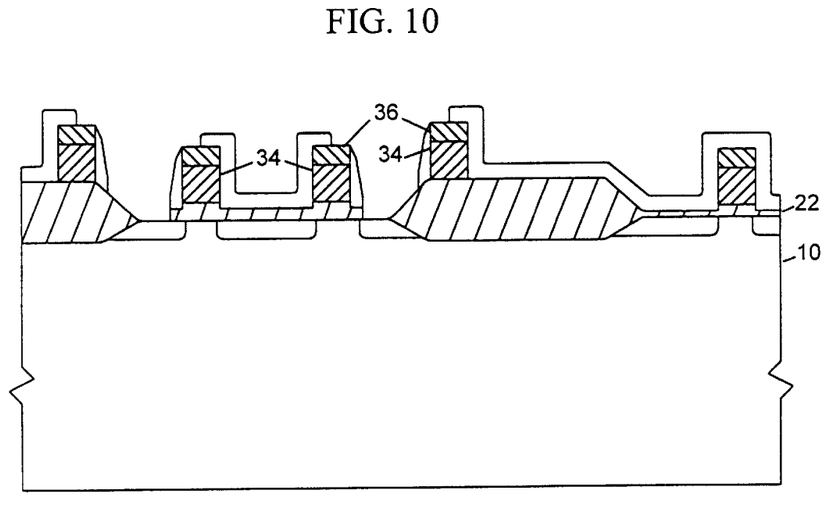
FIGS. 10 and 11 illustrate the substrate at two different stages of completion.
Figure 11:
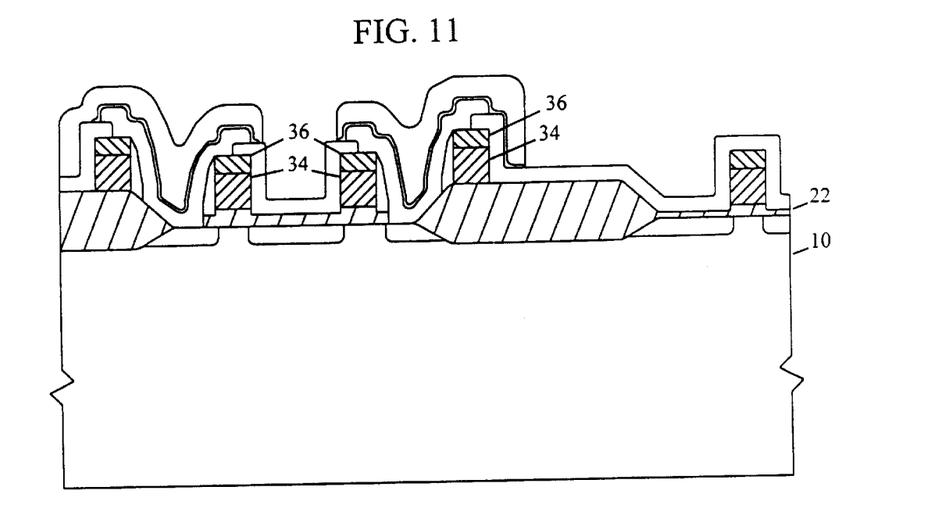
Figure 12:
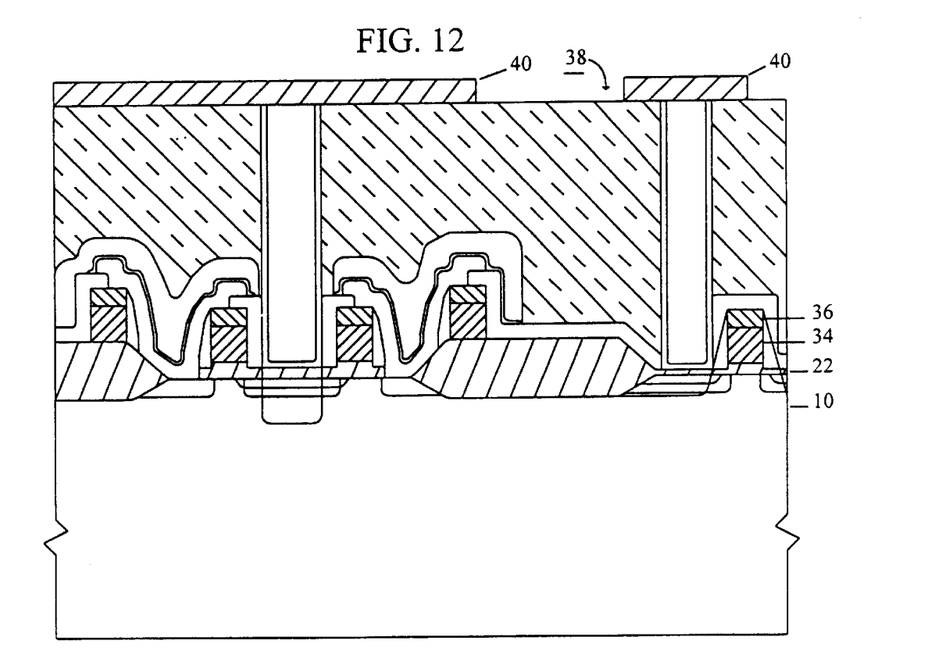
FIG. 12 illustrates a completed device.

A portion of the memory device is shown at two different stages of completion in FIGS. 10 and 11. A portion of the completed memory device 38 is illustrated in FIG. 12 in which metallic conductors 40 are in electrical contact with the active components comprising device 38.

The process steps of the present invention result in a memory device in which static refresh is improved. Additionally, the subthreshold voltage of the access transistor is also improved. Finally, gate induced drain leakage (GIDL) is reduced thereby improving overall performance.

As previously mentioned, the process disclosed herein utilizes a photoresist mask as both an implant mask and an etch mask thereby eliminating a number of steps and eliminating the need for a separate mask. That improves the efficiency of the process. Also, the process itself, as described above, results in a device which has improved characteristics.

While the present invention has been described in connection with preferred embodiments thereof, those of ordinary skill in the art will recognize that many modifications and variations may be practiced which do not part from the spirit and scope of the present invention. All such modifications and variations are intended to be covered by the foregoing description and the following claims.

What is claimed is:

1. A process performed on a substrate carrying a plurality of pad oxide regions, comprising:

stripping a plurality of pad oxide regions and growing a first oxide layer;

masking the first oxide layer with a photoresist to protect an area where an array transistor will be formed;

stripping the first oxide not protected by the photoresist;

stripping the photoresist; and growing a second oxide layer which is thinner than the first oxide layer, using said second oxide area to form a peripheral transistor.

2. The process of claim 1 additionally comprising the step of masking and etching the first oxide layer and second oxide layer to form gate regions of different thicknesses.

3. The process of claim 1 additionally comprising the steps of masking the first oxide layer with a photoresist to define local integrated field implant areas, performing a field implant in the area where said array transistor will be formed, and stripping the photoresist before the step of masking the first oxide layer with a photoresist to protect the area where said array transistor will be formed.

4. The process of claim 3 additionally comprising the step of performing an implant before the step of stripping the first oxide not protected by the photoresist.

5. The process of claim 1 additionally comprising the steps of depositing a layer of polysilicon, and etching the polysilicon with an etch that stops upon reaching the second oxide layer.

6. The process of claim 1 additionally comprising the steps of:

using at least a portion of said first oxide layer as a gate oxide for said array transistor; and using at least a portion of said second oxide layer as a gate oxide for said peripheral transistor.

7. The process of claim 1 additionally comprising the steps of:

depositing a layer of polysilicon;

masking said layer of polysilicon; and etching both said layer of polysilicon and portions of said first and second oxide layers according to said masking.

* * * * *

UNITED STATES PATENT AND TRADEMARK OFFICE
CERTIFICATE OF CORRECTION

PATENT NO. : 6,548,340 B2
DATED : April 15, 2003
INVENTOR(S) : Fernando Gonzalez It is certified that error appears in the above-identified patent and that said Letters Patent is hereby corrected as shown below:

Column 2,
Line 35, delete "fist" and substitute therefore -- first --.

Column 3,
Line 14, delete "striping" and substitute therefore -- stripping --.

Signed and Sealed this

Twelfth Day of August, 2003

JAMES E. ROGAN
*Director of the United States Patent and Trademark Office*